United States Patent [19]

Walsh et al.

[11] Patent Number: 4,894,124
[45] Date of Patent: Jan. 16, 1990

[54] THERMALLY STABLE DUAL METAL COATED LAMINATE PRODUCTS MADE FROM TEXTURED POLYIMIDE FILM

[75] Inventors: Daniel P. Walsh, Peabody, Mass.; Philip D. Knudsen, South Berwick, Mich.

[73] Assignee: Polyonics Corporation, Newbury Port, Mass.

[21] Appl. No.: 268,246

[22] Filed: Oct. 31, 1988

Related U.S. Application Data

[62] Division of Ser. No. 155,897, Feb. 16, 1988.

[51] Int. Cl.[4] .............................................. C25D 5/54
[52] U.S. Cl. ...................................... 204/30; 204/371; 204/38.4
[58] Field of Search .................. 204/20, 30, 37.1, 38.4

[56] References Cited

U.S. PATENT DOCUMENTS

| | | | |
|---|---|---|---|
| 3,011,920 | 12/1961 | Shipley, Jr. | 117/213 |
| 3,062,666 | 11/1962 | McLeod et al. | 106/1 |
| 3,140,188 | 7/1964 | Zirngieble et al. | 106/1 |
| 3,179,614 | 4/1965 | Edwards | 260/30.2 |
| 3,179,634 | 4/1965 | Edwards | 260/78 |
| 3,338,726 | 8/1967 | Berzins | 106/1 |
| 3,531,301 | 9/1970 | Watson | 106/1 |
| 3,537,878 | 11/1970 | Baudrand et al. | 117/47 |
| 3,562,038 | 2/1971 | Shipley, Jr. et al. | 156/3 |
| 3,573,937 | 4/1971 | Drotar et al. | 117/212 |
| 3,682,960 | 8/1972 | Haller | 260/32.6 |
| 3,767,538 | 11/1973 | Politycki et al. | 204/30 |
| 3,791,848 | 2/1974 | DeAngelo | 117/47 |
| 3,821,016 | 6/1974 | DeAngelo | 117/47 |
| 3,954,570 | 5/1976 | Shirk et al. | 204/15 |
| 4,078,096 | 3/1978 | Redmond et al. | 427/98 |
| 4,148,969 | 4/1979 | Henderson | 428/458 |
| 4,297,397 | 10/1981 | Feldstein | 427/304 |
| 4,496,794 | 1/1985 | Darms et al. | 174/68.5 |
| 4,503,112 | 3/1985 | Konicek | 428/675 |

Primary Examiner—John F. Niebling
Assistant Examiner—William Leader
Attorney, Agent, or Firm—Paul J. Cook

[57] ABSTRACT

Both surfaces of a uniformly and completely textured polyimide sheet are coated with a layer of electroless nickel or cobalt and a subsequent layer of electrolytically applied copper yielding an adhesiveless laminate useful in the production of electronic circuitry. The copper and nickel or cobalt layers are strongly bonded to the textured polyimide sheet to the extent that the laminate exceeds bond strength requirements as measured by current standard peel strength tests of the Institute for Interconnecting and Packaging Electronic Circuits (IPC) for both initial and post solder float adhesion, as well as a modification of IPC test 2.4.9 method E for resistance to thermal cycling.

25 Claims, 5 Drawing Sheets

THERMALLY STABLE DUAL METAL COATED LAMINATE PRODUCTS MADE FROM TEXTURED POLYIMIDE FILM

REFERENCE TO RELATED APPLICATIONS

This application is a continuation-in-part of application Ser. Nos. 018,346 and 018,342, each filed February 24, 1987.

BACKGROUND OF THE INVENTION

This invention relates to a process for coating one or both surfaces of a polyimide sheet with electrolessly deposited nickel or cobalt and electrolytically deposited copper, and to the thermally stable laminate product obtained by the process.

Certain electronic assemblies have conductor traces on both sides of a dielectric substrate. Preferred dielectrics for applications requiring flexible substrates, especially in multilayer constructions, involve the use of polyimide films. In general practice the conductive layers on this substrate are provided through the use of metal foils and adhesives specially formulated for their physical and thermal stability. The conductive layers are also provided in some cases through direct metalization by sputtering or by electroless deposition involving methods well known to those versed in the art.

Currently there are no commercially available polyimide laminate materials produced in the absence of an adhesive, suitable for IPC Class 3 electronic circuit applications. The adhesive bonding method has certain disadvantages especially in critical service and multilayer applications, where either properties of the adhesive or the physical space occupied by the adhesive are limiting factors. For example, these adhesive-bonded laminate materials exhibit poor dimensional stability, a severe disadvantage for laying up multilayer boards. The preferred construction (especially in multilayer applications) would avoid the use of adhesives and provide the metal directly bonded to the substrate. Until the present invention, however, the methods available for direct metalization of polyimide film substrates had more significant drawbacks than the adhesive bonding methods.

Two methods for preparing polyimide adhesiveless metal coated laminates are the related methods of vacuum and sputter deposition, followed by electrolytic copper buildup to desired thicknesses. Sputtering provides better adhesion than vapor deposition but neither technique provides physical properties adequate for critical service applications. Several commercially available single-sided materials are produced by these methods. The adhesion values obtained on subsequent copper buildup to greater than 25 82 m are very low for materials with sputtered copper. One structure has an initial chromium layer sputtered to the polyimide film which is then covered with a sputtered layer of copper is described in U.S. patent application Ser. No. 775,918. A disadvantage of this construction is that chromium is not removed easily during subtractive processing of electronic traces using standard etchants designed to remove copper.

An alternative method for preparing a polyimide adhesiveless metal clad laminate is to cast a liquid solution of a polyamic acid onto the surface of a metal foil, and to heat the entire composition to a temperature which will imidize the polyamic acid and form a polyimide or amide modified polyimide film. Several modifications of this basic technique are disclosed in U.S. Pat. Nos. 3,682,960; 3,781,596; 3,981,691; 4,148,969; 4,496,794 and 4,675,246. At present, laminates produced by this technique have limited application areas due to their poor dimensional stability. This method is also limited by the availability of suitable foil thicknesses.

In order to provide an adherent metal layer or layers to a polyimide film substrate by chemical metal deposition, several basic procedures are employed. Since processing is done in aqueous solutions, the surface of the polyimide film must be rendered hydrophilic to facilitate uniform adsorption of the catalyst used for seeding the electroless metal deposition. Commonly referred to as etching, this treatment also serves to microetch the surface of the polyimide, thus providing a mechanical interlock between the polyimide and metal layer. This surface preparative step will be referred to herein as texturing for purposes of this application to avoid confusion with the removal of unwanted metal during circuit preparation which also is referred to as etching in the printed circuit industry.

U.S. Pat. Nos. 3,791,848 and 3,821,016 to DeAngelo disclose an aqueous ethylenediamine composition wherein the diamine is present in an amount in excess of its degree of solubility, thereby forming a two-phase system. The preferred aqueous basic compounds are disclosed as the hydroxides of the alkali metals including sodium, potassium, lithium, rubidium, and cesium. The examples are specifically directed to texturing with sodium hydroxide in very strong solution containing the ethylenediamine in suspension so as to yield a pitted surface on the polyimide. Since a two-phase system is utilized, the polyimide surface tends to be non-uniformly and incompletely textured. The degree of texturing for a given portion of the surface depends upon which phase of the solution to which a portion of the surface is primarily exposed. These non-uniformities result in subsequent non-uniform deposition of catalyst and electroless metal and in a rough irregular appearance of the final metal coated film, and variable bond strengths of subsequently deposited metal layers.

U.S. Pat. No. 4,517,254 to Grapentin et al claims the use of various metal chelators primarily EDTA (ethylenediamine tetratetraacetic acid) derivatives, and NTA (nitrilo triacetic acid) in dilute caustic solutions as treating agents to prepare polyimide thin films for metalization. Grapentin suggests a long list of many possible amine compounds which could be combined in mixtures containing caustic, but no specific examples are provided other than the above, to determine which mixtures would provide benefit, and to what extent. It is known from DeAngelo that one could combine amines with caustic to affect the polyimide surface, but Grapentin provides no peel strength data, or description of the surface topography of his treated films. Grapentin does not describe the problem or propose a solution to treatment of film by two phase mixtures. The Grapentin patent therefore does not address the subject of a uniformly and completely textured surface and does not clearly identify that his process does indeed provide a useable laminate material for class three circuit application.

U.S. Pat. No. 3,767,538 to Politycki et al describes an attempt to produce a well-adherent double-sided laminate on polyimide film. The film surface is roughened by a fresh mixture of sulfuric and hydrochloric acids or by mechanical impingement of sand on the surface and, if needed, a further sodium hydroxide treatment may be employed. The polyimide film is then heated to expel water and then seeded for metalization in a colloidal palladium bath. After this, an electrically conductive, water-vapor permeable continuous layer of silver is deposited by electroless deposition and the film is heated at 150° C. to expel water. Finally, a layer of copper is electrolytically deposited to form the laminate structure. No specific adhesion values are reported for the laminate produced by this method.

A high speed additive circuit on a polyimide substrate using electroless nickel for metalization (no etching of metal required) is described in U.S. Pat. No. 3,573,973 to Drotar et al. The basic process steps are: preparing the substrate, catalyzing, printing a mask, heat setting of the masking ink, electroless plating of a nickel/phosphorous alloy, heating at 195° C. to improve metal to polyimide bond and then either electrolytic plating or solder coating to decrease the electrical resistance of the resultant structure. The use of a nickel/phosphorous alloy as the metalizing layer may cause difficulty etching laminates produced by this method during subtractive circuit production methods. The adhesion values reported are 5.0 lb./in. maximum by a nonstandard test and there is no mention of the stability of the product to solder float or thermal cycling stress. The low adhesion of metal to polyimide limits the use of these laminates to specialty applications. The method of Drotar, therefore, does not provide a method for preparation of metal coated laminates for general use in the printed circuit industry.

In U.S. Pat. No. 3,954,570 to Shirk et al, another additive method is disclosed wherein the electroless deposit may be nickel or another metal. The authors cite no advantage of one metal over another in the initial metalizing step, and specifically claims a patterned flame sensitized surface which is catalyzed, preferably with tin and palladium, then electroless plated with either copper, nickel, or cobalt. The method of Shirk also provides low bond strengths, and for the nonstandard solder dip test disclosed, no advantage is recognized for the use of electroless nickel rather than electroless copper or cobalt.

Another additive method for circuit preparation on a polyimide substrate is disclosed in U.S. Pat. No. 4,078,096 to Redmond et al. The method described is for texturing the surface of the polymer with a hydrazine/caustic solution, catalyzing, then plating with either electroless nickel, copper or cobalt. The method relates to the preparation of a specific circuit type by an additive process, and the maximum initial peel strength disclosed is only 4.6 lb./in. which is too low for general use in the printed circuit industry. Samples made by the method of this patent result in cohesive failure of the polyimide film at bond values of only 4.0 lb./in. using the optimum formulation of 60 percent hydrazine hydrate and 9.3 percent sodium hydroxide disclosed by Redmond in Table II. This lowering of the cohesive strength of the film is alluded to by Redmond in Column 4, lines 37–40, where the failure mode of well adhered and poorly adhered samples is discussed. Cohesive failure at such low values indicates degradation of the polymer film which is seen as ripping in the Z-axis during peel testing. There is no disclosure of completely coating one or both surfaces of a polyimide sheet with electrolessly deposited metal followed by electrolytically deposited metal.

There have been prior attempts to provide an adherent metal layer on both sides of polyimide sheets by direct metalization using electroless copper followed by electrolytic copper buildup to the desired thickness. This technique has proven unsuitable in practice since blistering of the electroless copper layer usually occurs when simultaneously applied to both sides of the film. If blistering is avoided, the peel strength of the resultant laminate is less than that for a single-sided laminate of the same metal thickness.

Perrins, in *Transactions of the Institute of Metal Finishing* (1972) Volume 50, pp. 38–45, discloses a process for electroplating propylene polymers with electroless nickel or copper followed by electrolytic plating with copper. The plating in this case in conducted on only one side of propylene copolymer plaques. The use of the nickel provides improved adhesion especially after thermal cycling of the sample which will cause degradation of the copper/polymer bond. This process, where nickel is used as the base metal layer, has only been applied to injection molded or bulk processed polymers, but has not been extended for use on thin film substrates. Therefore, the nickel process has been restricted to use where the nickel layer is never removed but remains a permanent part of the finished article.

In "Applications of Additive Circuitry", a technical paper presented at the Institute of Printed Circuits in September, 1974, Brewer discloses a method in which nickel is deposited on both surfaces of a paper reinforced phenolic. Electroless copper is then deposited and the plated panel is heated beyond the glass transition temperature of the substrate materials to improve the nickel to polymer adhesion.

In *Plating and Surface Finishing*, "Interfacial Bonding of Nickel to Polyamide-Imide", Vol 66, No. 6, (June, 1979) pp.68–71, Levey et al, describes nickel plating on a rigid polyamide-imide substrate textured with an abrasive and/or sodium or potassium hydroxide. The article relates the effect of various surface treatments on metal adhesion, and specifically to the combination of mechanical abrasion followed by a chemical treatment such as dipping in aqueous alkali metal hydroxide solutions. The article states that no advantage was observed with the use of nickel rather than copper for the initial metalization of the polymer, and concludes that the adhesion of the metal to the polyamide-imide substrate is a combination of both mechanical and chemical factors related to the substrate.

Prior to the present invention, there has been no commercially viable method available for the direct coating of polyimide films with electrically conductive layers, without the use of an adhesive exhibiting adequate properties for general use in electronic circuitry. Adhesiveless laminates with metal on both sides have not been available due to the tendency for an electroless metal layer to blister during deposition onto both sides of a thin film, and to the destruction of polyimide to metal adhesion by thermal shock upon immersion in molten solder or because of undesirable reduction of film strength due to texturing. The problem of electroless metal blistering is especially acute in the complete metalization of thin polymeric film; hydrogen evolution during the deposition process has been suggested as a cause of electroless metal blistering. Electroless metal blistering on thin polymeric substrates is greatly reduced when the metal deposition is restricted to certain areas on the film (i.e., other than complete surface coverage).

In copending application Ser. No. 018,346, filed February 24, 1987, a process is disclosed for forming polyimide film coated on both surfaces with electroless nickel or cobalt and copper coated on the nickel or cobalt which is useful for forming printed circuits. The resulting laminate is capable of passing IPC tests for peel strength and solder float resistance. However, the product is inconsistent in passing modified IPC tests for thermal cycling stability wherein the product is subjected to a plurality of high temperature environments. Such a thermal cycling environment would be experienced by such a laminate product that forms a layer in a multi-layer laminate.

It would be desirable to provide a process for coating at least one surface and preferably both surfaces of a polyimide film with electrolessly deposited metal, followed by electrolytically deposited copper having sufficient adherent strength to the polyimide and sufficient resistance to thermal shock to render the resultant laminate useful for fabricating electronic circuits.

SUMMARY OF THE INVENTION

The present invention is directed to a process whereby a polyimide sheet or continuous web of uniformly and completely textured polyimide film is uniformly coated on one or both surfaces with a strongly adherent electroless nickel or cobalt layer followed by an electrolytic copper layer. The polyimide film coated with nickel or cobalt or including a thin copper coating on the nickel or cobalt coating is mechanically worked to form microcracks in the initial thin metal coatings thereby exposing a portion of the polyimide surface. The mechanically worked laminate then is heated to volatilize any volatilizable components, such as moisture in the laminate. The resultant laminate then is coated with electrolytic copper on both surfaces.

Adherent layers of exposed copper are uniformly plated on one or both sides of the sheet and metal layers of controlled thickness are produced which provide laminates useful for the production of electronic circuitry. These laminate structures are suitable for general use in the production of electronic circuitry. The terms "web", "sheet" and "film" are used herein interchangeably and refer to thin flat, flexible polymer substrates.

In accordance with the present invention, there is provided a process for forming an adherent exposed copper coating on the surfaces of a polyimide sheet or film such as the type prepared from the anhydride of pyromellitic acid and 4,4'-diamino-diphenyl ether. At least one surface of a polyimide sheet is first treated with a one-phase solution of an alkali metal hydroxide, an alcohol, and a diamine of the formula $H_2N(CH_2)_nNH_2$ wherein n is an integer from 2 to 6, preferably ethylenediamine, to provide a textured and hydrophilic surface, where a uniformly and completely textured surface of a particular topography is produced and the mechanical bulk properties of the film are substantially unaffected. The one phase solution should have sufficient solvent affinity for the polyimide from each surface but should not have such a high affinity for the polyimide to materially reduce the mechanical strength of the polyimide sheet, below that of an untreated film having essentially the same thickness. Suitable one phase three component solvent composition can be determined by the method set forth in Example 9, and FIGS. 9 and 10. Representative suitable one phase solvent compositions comprise 5 to 25 weight percent diamine, 3 to 40 weight percent alkali metal hydroxide and 10 to 50 weight percent alcohol or a mixture of alcohols one of whose function is to act as cosolvent and provide a one phase solution and the balance water. The particular weight percent of each of the three components of the texturant composition will vary depending upon the components employed. In each case, however, the degree of milling and the determination of whether the texturant composition is one phase can be obtained by the procedure of Example 9 to generate figures such as FIG. 9 and 10 to determine suitable weight percents of the three components. The surface of the textured film is characterized by nodules or bumps, rather than pits as reported for other texturing methods. When viewed through a microscope, the completeness of surface texturing is readily seen. Scanning Electron Micrographs (SEM) of the film textured by the methods of U.S. Pat. Nos. 3,791,848 and 4,078,096 to DeAngelo and Redmond respectively, are shown in FIGS. 3, 4 and 5 as compared to the film textured by the method of this invention as shown in FIG. 6. The substantially complete texturing produced by this method can be seen by the more pronounced and uniform appearance of the surface features, (bumps) as compared to the film produced by either of the other prior art methods which are smoother in appearance and therefore not as completely textured.

The surface of the film is rendered uniformly frosted and matte with a translucent appearance so that a surface receptive to colloidal catalyzation and the subsequent electroless deposition of an electrically conductive metal layer is provided, yet the original mechanical bulk properties of the film are substantially unaffected. The resulting uniformly and completely textured surface of the polyimide film is contacted with colloidal palladium in order to provide a catalytic surface for the deposition of electroless nickel or cobalt. Nickel or cobalt is then deposited on the receptive surfaces by electroless deposition to form a layer which is electrically conductive. As used herein, the term "nickel", as it relates to the initial metal layer, includes nickel metal or a nickel containing alloy such as nickel/phosphorous, nickel/boron, etc. Also as used herein, the term "cobalt", as it relates to the initial metal layer includes cobalt metal or a cobalt containing alloy.

In accordance with the improvement of this invention, the polyimide sheet coated with nickel or cobalt on both surfaces is mechanically worked to form microcracks in the nickel or cobalt. The mechanical working can be effected either prior to or subsequent to coating the nickel or cobalt surfaces with a thin layer (less than about 1.2 $\mu$m) of copper within which microcracks also can be formed. The mechanically worked and microcracked nickel coated laminate is then heated to volatilize the volatilizable components of the polyimide film core, such as water. As a final layer, electrolytic copper is applied to the laminate on both surfaces to the desired thickness. When tested according to IPC test 2.4.9 (July 1985 update), these laminates are characterized by peel strengths of at least 6.0 lb./in. by Method C. These laminates also pass IPC test 2.4.13 (December 1982 update). All test methods referred to herein are from IPC TM 650, and are performed using laminates that have been coated with metal to a standard thickness of 35 $\mu$m. These are test methods normally used by circuit manufacturers to determine laminate material quality. When the electroless nickel or cobalt thickness is greater than about 0.5 $\mu$m with either of these two constructions, adhesion values of at least 5.0 lb./in. and usually greater than 6.0 lb./in. can be obtained with IPC test 2.4.9. Method C. The double-sided construction passes a modification of IPC test 2.4.13 where metal remains on both sides of the sample. The laminates of this invention also pass a modification of IPC test 2.4.9 Method E for determining the resistance of the laminate to thermal cycling. In this modified test a sample is subjected to three consecutive thermal cycles from room temperature to 350° F. at 350 PSI for one hour. Prior to this present invention, no double-sided laminates, apart from adhesive-based laminates, were capable of passing this more stringent test.

The textured film produced by the texturant outlined above, and the subsequent use of nickel or cobalt as the initial metalization in a unique two-step sequence, yields a superior copper plated adhesiveless laminate. The combination of these two steps provides enhanced solder float resistance, which is not obtained by the use of nickel metalization alone on untextured film, as shown in Example 2 of this application.

In another aspect of this invention, a laminate construction is provided which is coated on both surfaces with electroless nickel or cobalt and electrolytic copper, and has a peel strength of at least 6.0 lb./in. and usually greater than 7.0 lb./in. by IPC test 2.4.9 Method A, and at least 4.5 lb./in. by IPC test 2.4.9, Method C. When the electroless nickel or cobalt thickness is greater than about 0.5 μm on this double-sided laminate construction, adhesion values are greater than 6.0 lb./in. by IPC test 2.4.9., Method C.

DESCRIPTION OF THE SPECIFIC EMBODIMENTS

Figure 1:
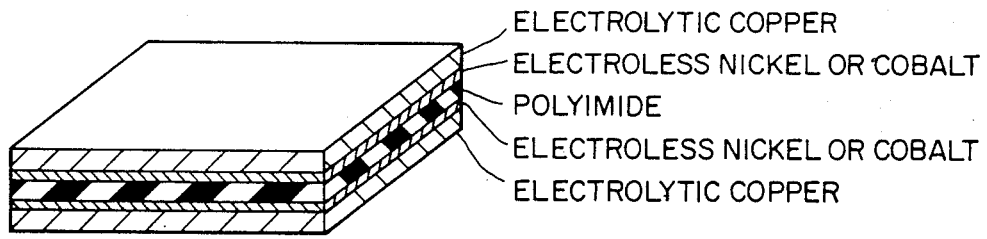
FIG. 1 shows the embodiment of this invention where polyimide film is coated on both sides with nickel or cobalt and copper.

In the preferred embodiment of this invention, the polyimide surfaces treated are of the type prepared from a polyimide-acid (also referred to as polyamic acid) which has the formula:

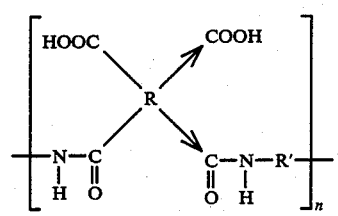

where the arrows denote isomerism, R is an organic tetravalent radical containing at least two carbon atoms, no more than two carbonyl groups of each polyamic acid unit being attached to any one carbon atom of said tetravalent radical; R' is a divalent radical containing at least two carbon atoms, the amide groups of adjacent polyamide-acid units attached to separate carbon atoms of divalent radical and n is a positive interger sufficient to provide the polyamic acid with an inherent viscosity of at least 0.1. The most preferred of such polyimides is Kapton (Trademark registered to Dupont) and Apical (Trademark of Allied-Signal Co.) which is the polyimide formed from pyromellitic anhydride,

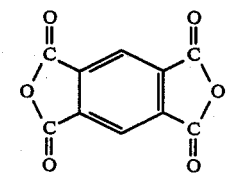

and 4,4'-diamino-diphenyl ether,

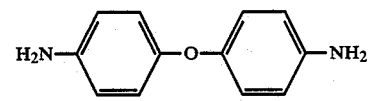

and having the general formula:

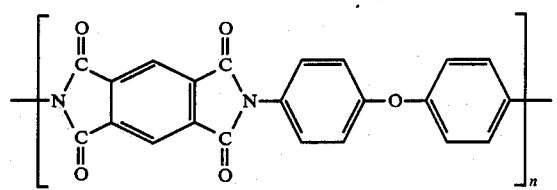

where n is an integer ranging from 150 to 650 and which has an average molecular weight of 60,000 to 250,000. The above polyimides and their preparation are described in U.S. Pat. Nos. 3,179,614 and 3,179,634 to Edwards, which are incorporated herein by reference.

The polyimide can have any thickness suitable as a substrate for electronic circuitry, and most generally is in the form of a relatively thin sheet having a thickness of between about 12 and 125 μm. Prior to this invention, a polyimide film coated on both sides with a permanently bonded metal comprising electroless nickel or cobalt followed by electrolytic copper capable of passing current IPC tests in particular IPC tests 2.4.9 and 2.4.13, for adhesion and thermal shock has not been available. Moreover, the stability of the metal layers on these coated films against thermal cycling has not been achieved consistently without the use of a separate adhesive layer. Tests for thermal cycling are designed to test the resistance against delamination of the laminate product of this invention under the conditions of alternating (a) high temperature and pressure and (b) room temperature. The modification of IPC test 2.4.9 Method E described herein is intended to simulate conditions that would be experienced by the laminate material during the manufacture of a typical multilayer circuit product, wherein the laminate of this invention would make up one or more of the multiple circuit layers. The actual test used is as follows:

A sample of the laminate of this invention is masked and etched to produce ⅛th inch wide lines of copper plated on the electroless nickel or cobalt. The sample of the etched laminate to be tested is placed in a cold laminating press between two sheets of Kraft paper, and held flat with two steel platens also referred to as caul plates in the industry. The platens are pressurized to 350 PSI, the temperature is raised to 350° F. and once the high temperature is attained, the sample is held at that temperature and pressure for one hour. The sample is then allowed to cool to room temperature, the pressure is released and the cycle is repeated twice more. Once the sample has passed through this sequence of steps it is then tested for peel strength adhesion as in IPC Test 2.4.9 Method A. Adhesion values greater than 3.5 lbs./inch are confirmation of a useful laminate material.

The test is designed to imitate actual laminating conditions anticipated during circuit manufacture. This test will be referred to in the specification and claims as "Modified Thermal Cycling IPC Test 2.4.9, Method E".

Two basic techniques for preparing electronic circuits which involve removal of unwanted metal are briefly outlined below.

| Semi-additive Process | Subtractive Process |
| --- | --- |
| Thin Laminate (e.g., 0.5-8 um metal) | Thick Laminate (e.g., 35 um metal) |
| Apply resist | Apply resist |
| Photoimage | Photoimage |
| Develop resist | Develop resist |
| Electrolytic copper plate (e.g., 35 um) | Etch unmasked metal |
| Strip resist | Strip resist |
| Etch to remove thin laminate metals in non-circuit areas. | |

No modification of existing procedures for the production of said circuitry is necessary using laminates of this invention. A further advantage for the use of the method of this invention is that metal thicknesses can be provided easily from extremely thin to very thick layers. Laminates with layers of metal less than about 18 μm (½ ounce) are difficult to produce using present adhesive laminate production methods with metal foils, but are easily produced in a continuous roll-to-roll plating process by the method of this invention.

Figure 9:
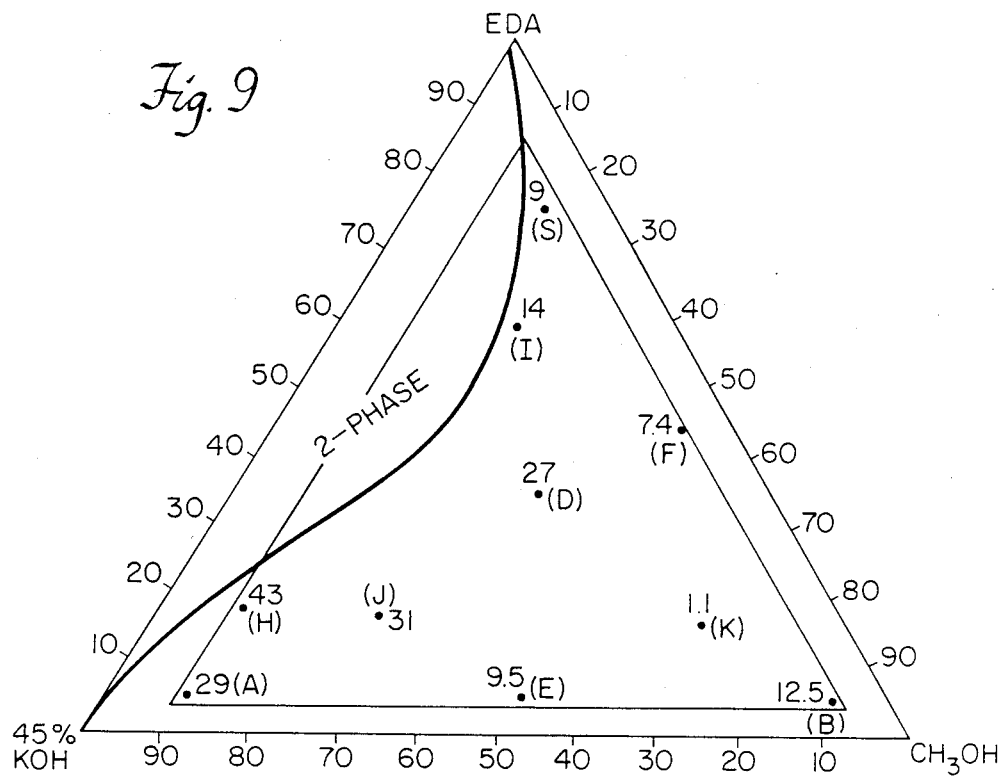
FIG. 9 is a three component mixture diagram showing weight loss at each texture composition from Example 9.

The polyimide film surface should be relatively clean, but a cleaning or degreasing step may be performed (if necessary) prior to contact with a suitable texturant. The texturant of this invention provides a uniformly and completely frosted or matte appearance to the surface of the film which is due to nodules remaining when surrounding material is selectively dissolved by the texturant. A suitable texturing process is disclosed in an application entitled "Textured Polyimide Film" of Daniel P. Walsh, Ser. No. 018,342, filed February 24, 1987. The one-phase texturing composition is comprised of an alkali metal hydroxide, a diamine of the formula $H_2N(CH_2)_nNH_2$ wherein n is an integer from 2 to 6, preferably ethylenediamine, and a water miscible alcohol such as methanol, ethanol, isopropanol or n-propanol, preferably methanol. The alkali metal hydroxide can comprise potassium hydroxide, sodium hydroxide, lithium hydroxide or mixtures thereof with potassium hydroxide being preferred. In addition, quaternary ammonium hydroxides such as tetramethylammonium hydroxide, can be used. The concentration of the diamine in the texturing solution is sufficient to effect the desired surface modification without forming a two-phase liquid composition and is between about 5 and 25 percent by weight. Suitable compositions range between 3 and 40 percent by weight alkali metal hydroxide, 5 to 25 percent by weight diamine, and 10 to 50 percent by weight of the alcohol or mixture of alcohols one of whose functions is to act as a cosolvent and provides a one phase solution; the balance of the mixture is water. The particular percentage of each component in the texturant is adjusted according to the content of alkali hydroxide or diamine in order to maintain a one-phase system at the temperature used for texturing the film. Specific compositions and approximate milling and texturing effect for these compositions is exemplified in a three component mixture diagram shown in FIGS. 9 and 10. As set forth above, the textured film of this invention is uniformly and completely textured so that at least about 5 weight percent of the polyimide is milled from each polyimide film surface. This textured film can also be useful as a substrate for the fabrication of adhesive-based metal clad laminates.

Once the clean polyimide surface has been treated to render the surface textured and hydrophilic, the film is catalyzed with any one of the catalyst systems well known to those versed in the art of electroless plating. Catalyst combinations which can be used in conjunction with the sensitized polyimide surface are disclosed in U.S. Pat. Nos. 3,011,920 and 3,562,038 which are incorporated herein by reference. The catalyst may be applied in a two step application, by first depositing the sensitizer and then the noble metal activator; however, these baths may be combined in a one step operation, e.g., a black colored tin-palladium colloidal dispersion. The catalyzing is provided for a period of one to five minutes, and then the sample is immersed in an acidic solution to remove tin from the surface in a process referred to as acceleration. The sample is then placed in an electroless nickel or cobalt bath for a period ranging from about two to ten minutes to provide the desired thickness of nickel.

Suitable electroless nickel baths are disclosed in U.S. Pat. Nos. 3,062,666; 3,140,188; 3,338,726; 3,531,301; 3,537,878; and 3,562,038 which are incorporated herein by reference. Some typical formulations are shown:

| | | |
|---|---|---|
| 1. | Nickel chloride (NiCl$_2$.6H$_2$O) | 20.0 g/l |
| | Sodium hypophosphite (NaH$_2$PO$_2$.H$_2$O) | 60.0 g/l |
| | Ammonium oxalate ((NH$_4$)$_2$C$_2$O$_4$.H$_2$O) | 40.0 g/l |
| | Ammonium Hydroxide 25% | 60. ml/l |
| | pH 8.2, 85° C. | |
| 2. | Nickel Sulphate (NiSO$_4$.6H$_2$O) | 20.0 g/l |
| | Dimethylamine Borane | 3.0 g/l |
| | Citric Acid | 10.0 g/l |
| | Conc. HCl | 25.0 ml/l |
| | pH 5.2–5.5, 95° C. | |
| | Ammonium Hydroxide | to pH 7.0 |
| | 2-Mercaptobenzothiazole | 0.5–2.0 mg/l |
| | 65° C. | |
| 3. | Nickel Sulfate (NiSO$_4$;6H$_2$O) | 17.1 g/l |
| | Sodium Hypophosphite (NaH$_2$PO$_2$.H$_2$O) | 14.0 g/l |
| | Acetic Acid 80% | 12.0 g/l |
| | MoO$_3$ 85% (adjust to control rate) | 5.0 mg/l |
| | pH 5.2–5.5, 95° C. | |
| 4. | Nickel Chloride (NiCl$_2$.6H$_2$O) | 16.0 g/l |
| | Dimethylamine Borane | 3.0 g/l |
| | Sodium Citrate | 18.0 g/l |
| | Glycine | 8.0 g/l |
| | Bismuth Nitrate | 20.0 mg/l |
| | Thiourea | 15.0 mg/l |
| | pH 7.0, 65° C. | |

Nickel or cobalt is deposited on the receptive surfaces by electroless deposition to form a metal coated surface. Nickel ions are reduced in this process onto the catalytic surface to form a continuous electrically conductive layer. The electroless layer must be sufficiently thick to permit the subsequent electrolytic deposition of a uniform copper layer. Generally, the electroless nickel or cobalt layer is between about 0.25 μm and 1.0 μm thick but can be thicker if desired. No substantial advantages are obtained with nickel or cobalt coatings greater than about 1.0 μm.

The use of nickel or cobalt rather than copper as an initial metal layer provides several significant advantages. In the electroless deposition of metal, a certain amount of hydrogen gas is liberated as part of the reaction. Hydrogen gas is generally considered a cause of blistering during electroless copper deposition on polyimide and blistering has been a problem associated with production of a double-sided laminate on polyimide films when electroless copper is used for initial metalization. When electroless nickel or cobalt is substituted for electroless copper for direct deposition on polyimides, especially nickel or cobalt deposited from a borane reduced bath, blistering is alleviated. Unexpectedly, it has been found that electroless nickel/boron alloys etch more easily than electroless nickel/phosphorous alloys when standard copper etchants such as cupric chloride are used. The nickel/boron alloy producing baths are easier to use with a continuous reel to reel process and are not as prone to catastrophic decomposition as are nickel/phosphorous baths. It is preferred to utilize electroless nickel baths wherein the reducer for the nickel is dimethylamine borane (DMAB), since the resultant nickel coating can be subsequently etched with a common etching solution such as cupric chloride. Electroless cobalt can also be deposited from a bath formulation using DMAB as a reducer and may find use as an initial metal layer. Copper is not useful as initial metal layers because it can catalyze degradation of the polyimide and lead to poor post solder float peel strength values due to thermal sensitivity of the final laminate structure.

While the double metal coated laminate product described and claimed in the copending patent application Ser. No. 018,346 provides substantial advantages over prior art laminates, it is characterized by inconsistent resistance to thermal cycling especially on double-sided laminates. That is, the double sided product tends to develop reduced metal adhesion and thus peel strengths when exposed to repeated conditions of high temperature of the order that would be experienced in the production of the typical multilayer circuit board. For this reason its utility is limited to circuitry where little or no high temperature lamination is required, as for example the production of TAB (tape automated bonding) circuits. A major use of such laminates presently is in multilayer circuits wherein the laminates, in the form of double sided circuits are adhesively bonded to each other under conditions of high temperature and pressure, usually in a stack of three to five laminates or more.

If the laminate experiences reduced peel strengths to below an acceptable minimum peel strength, it cannot be used for multilayer circuits. In accordance with the present invention, it has been found that, after the nickel or cobalt layers have been coated on the polyimide surface, if the resultant laminate is mechanically worked to form microcracks in the metal surface, following the heating, the product formed after the electrolytic copper of desired thickness is coated on the nickel or cobalt is characterized by excellent resistance to thermal cycling. The microcracks can be formed into the nickel or cobalt coating either directly or after a thin layer of electrolytic copper has been coated on one or both of the nickel or cobalt layers. The initial flash copper layer has a thickness such that microcracks form therein during the mechanical working. The electrolytic copper layer should be less than about 1.0 μm.

Figure 8:
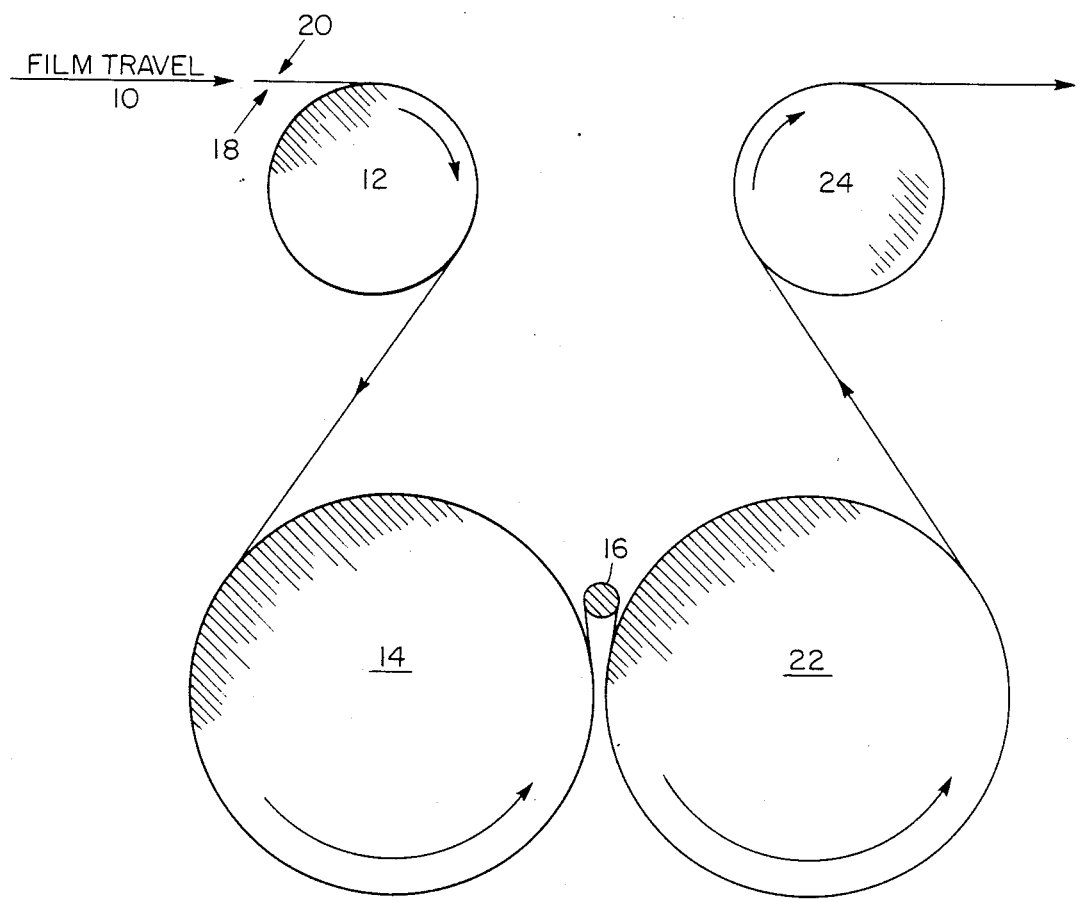
FIG. 8 is a diagram of the cracking apparatus used to produce the microcracks in the electroless nickel or electroless nickel and thin electrolytic copper layers as described in the method of this invention.

The mechanical working step can be conducted by a variety of means including passing the laminate in contact over a dull knife edge or any other means wherein the metal surfaces of the laminate are stressed and disrupted to form microcracks in the metal coatings. This can be done without delaminating the metal coating from the polyimide substrate of this invention. The preferred method for forming microcracks in the metal layers will be described in detail with reference to FIG. 8. A web of laminate 10 is passed over idler roller 12, support roller 14 and cracking roller 16. Cracking roller 16 has a sufficiently small diameter so that the compression forces on the underside surface 18 of laminate 10 and the tension forces on the topside surface 20 of laminate 10 are sufficient to cause the formation of microcracks in the metal layers of both surfaces 18 and 20. The laminate 10 then is passed over rollers 22 and 24. The microcracks run generally parallel to the main axis of roller 16 and extend through the entire thickness of the metal layers so that the polyimide surfaces in contact with the surfaces of the microcracks are exposed to the atmosphere. The laminate having the microcracks therein then is heated to a temperature at which volatilizable components such as moisture in the polyimide layer can volatilize and escape the laminate through the microcracks. The heating can be conducted in any convenient manner such as by baking in an oven or passing the laminate through a heated inert oil such as silicone, fluorocarbon, or peanut oil. The heating is conducted at a temperature and for a time sufficient to effect substantially complete removal of the volatilizable materials from the polyimide sheet without degrading the polyimide layer or the metal layers. Generally, heating is effected at a temperature between about 165°

C. and 225° C., preferably between about 180° C. and 210° C. for a period of about 5 to 20 minutes. The cracked and baked film can then be electroplated without readsorbing deleterious amounts of water into the core polyimide film presumably since the transport rate of water vapor through the cracked nickel film is much higher than that of water from the aqueous process solutions. In order to improve the subsequent electrolytic deposition, the metal surfaces are cleaned to remove or reduce the metal oxides thereon. The passive nickel oxide layer can be removed with an acid cleaner which should not be so strong as to remove the nickel layer itself. Suitable cleaners are aqueous solutions of sulfamic or citric acid. The resultant laminate is then coated with electrolytically deposited copper to the desired thickness.

A serious deficiency of prior adhesiveless laminates when compared to their adhesive-based counterparts is their failure when subjected to standard testing for thermal failure by IPC test 2.4.9 Method C. This thermal shock failure is characterized by catastrophic loss of bond strength after solder float. The laminates made from the present invention have superior performance when compared to presently available single-sided adhesiveless laminate structures. When tested for metal to substrate adhesion after solder float as per IPC test 2.4.9, Method C, adhesion in the 4.5 to 5.0 lb./in. range is typical. With thicker nickel metalization, values greater than 6.0 lb./in. can be obtained. When copper is used as the first electroless metalizing layer rather than nickel on single-sided laminate structures, post solder float values are usually less than 3.0 lb./in., and total metal delamination (blowoff) is common. The method of this invention provides single-or double-sided adhesiveless laminates which provide products that pass solder float adhesion testing by IPC test 2.4.9 Method C and that pass the Modified Thermal Cycling IPC Test 2.4.9 Method E.

The combination of proper polyimide film pretreatment and electroless bath chemistry, has provided an adhesiveless laminate superior to those presently available. A laminate with these particular properties has not heretofore been available. In particular, this invention provides a laminate with the following advantages over the prior art:

1. Single or double-sided adhesiveless laminate constructions with excellent adhesion.
2. Initial adhesion values superior to those obtained using electroless copper for both single-and double-sided laminate constructions.
3. Post solder float adhesion greater than that obtained by other methods, with no random failure or blowoff during solder float testing as per IPC test 2.4.9 or 2.4.13.
4. Excellent resistance to thermal cycling effects encountered during multilayer circuit fabrication.
5. A superior laminate provided consistently with both sheet and roll-to-roll processing of the film.
6. Laminate structures can be provided having very thin conductive layers produced at significant cost savings, and more reliably than those produced by prior methods.
7. Laminate structures with improved flex ductility when compared to the adhesive-based and adhesiveless laminates presently available.
8. Laminate structures which have improved dimensional stability when compared to adhesive-based laminates.
9. Metal coated laminates processable under conditions normally utilized for production of circuitry when a nickel/boron alloy is used for initial metalization.

The following examples illustrate the present invention and are not intended to limit the same.

EXAMPLE 1

A 14 inch wide continuous web of type VN200 Kapton brand polyimide film is treated to render the surface hydrophilic and textured with an aqueous alkali metal hydroxide, methanol and ethylenediamine composition. The texturing composition is comprised of 37.4 percent by weight potassium hydroxide, 10 percent by weight methanol, and 7.0 percent by weight ethylenediamine (EDA) in an aqueous solution. Total film thickness is reduced from 48 to 41 $\mu$m in the texturing process and the film has a uniformly and completely frosted appearance. This treated film is further processed on both surfaces with the following sequence:

1. 60 sec. at 25° C. in 23% solution of an aqueous acid bath sold under the tradename, Cataprep 404 available from Shipley Company, Inc.
2. 120 sec. at 45° C. in a 3% concentration of an aqueous colloidal palladium catalyst sold under the tradename, Cataposit 44 available from Shipley Company, Inc.
3. Rinse for 60 sec. in water.
4. 180 sec. at 25° C. in a 10% of an acidic accelerator sold under the tradename, Shipley Accelerator 19 available from Shipley Company, Inc.
5. Rinse for 30 sec. in water.
6. 300 sec. at 65° C. in an electroless nickel plating solution, utilizing dimethylamine borane as the reducing agent, sold under the tradename Niklad 752 from the Allied Kelite division of Witco Chemical Corp. Final nickel thickness approximates 0.5 $\mu$m.
7. Pass the double nickel coated web through the apparatus of FIG. 8, to effect microcracking of the nickel layer, wherein the diameter of roller 16 is 1/16 inch and the diameter of rollers 14 and 24 is 2 inches, and at a rate of three feet per minute.
8. Bake the microcracked laminate from step 7 in an oven at 190° C. for 10 minutes.
9. Clean the samples for 30 seconds at 35° C. in a solution containing 3% by weight of sulfamic acid.
10. Electroplate with copper for 90 minutes at 15 amps per square foot (ASF) in a brightened copper sulfate bath containing 25 ounces per gallon of sulfuric acid, 15 ounces per gallon of copper sulfate pentahydrate, 50–70 ppm chloride ion, and 1.0% of an organic brightener sold under the tradename Copperlume PTH-R by M&T Chemicals Co. This provides a laminate coated with about 35 $\mu$m of copper.

After masking with chemically resistant tape, ⅛th inch lines are revealed using an acidic copper chloride etching solution to remove metal from unmasked areas of the sample. The tape is removed, the sample is dried and then an Instron Model 1000 Universal Testing Instrument is used to perform 90 degree peels using IPC Test 2.4.9, Method A. Average adhesion of 10.0 lb./in. on each side is obtained and no side to side variation is observed.

Other samples are then tested for adhesion after solder float as per IPC test 2.4.9, Method C. The etched lines are coated with less than 50 $\mu$m of Dow Corning high vacuum silicone grease, and floated for five seconds on molten solder which is held at 288° C. No metal blowoff is observed on the ⅛th inch traces, and the final adhesion of these heat shocked materials was 4.8 lb./in.

Other samples were tested for resistance to thermal cycling by the Modified Thermal Cycling IPC Test 2.4.9 Method E. These samples were compared to double nickel coated samples which were not passed through Step 7 (microcracking) and to samples which were passing through Step 7 but were not baked as in Step 8. All samples were coated with electrolytic copper to the same thickness as described above. The average results are tabulated below.

| # of Cycles | Cracked (No Bake (lb/in) | Cracked Baked (lb/in) | Uncracked (lb/in) |
|---|---|---|---|
| 0 | 7.0 | 6.5 (avg) | 9.5 |
| 3 | 1.0 | 5.5 (avg) | 1.0 |

EXAMPLE 2

Four inch by six inch samples of type VN200 Kapton brand polyimide film are textured by the four different compositions shown in the following table, then catalyzed by the procedure described in Example 1, and then metalized with either (a) an electroless copper bath containing formaldehyde as a reducing agent and sold under the tradename Enduroplate EP-407 by Hunt Chemical Co., or (b) the Niklad 752 electroless nickel/boron bath described earlier. The EP-407 bath is a low deposit electroless copper bath which has been found to provide the best results of commercial copper bath formulations tested on polyimide film textured by the method of this invention.

| | TEXTURANT COMPOSITIONS | | | | |
|---|---|---|---|---|---|
| Texturant | NaOH | KOH | EDA | CH₃OH | H₂O |
| A -* | 0.0% | 41.8% (10.5 M) | 7.0% | 0.0% | 51.2% |
| B -** | 28.0% (9.1 M) | 0.0% | 7.0% | 0.0% | 65.0% |
| C | 0.0% | 37.4% | 7.0% | 10.0% | 45.6% |
| D | 27.7% | 0.0% | 7.0% | 10.0% | 55.3% |

*- Texturant from Example 1D, U.S. Pat. No. 3,791,848 to DeAngelo, where 45 percent by weight potassium hydroxide is substituted for 10 N sodium hydroxide.
**- Texturant from Example 1D, U.S. Pat. No. 3,791,848 to DeAngelo.
- Texturants C and D are homogeneous single phase liquid compositions in accordance with this invention.

Figure 3:
FIG. 3 is an SEM (scanning electron micrograph), at 500× magnification, showing the textured film made by the method of DeAngelo as outlined in Example 2 of this application.
Figure 6:
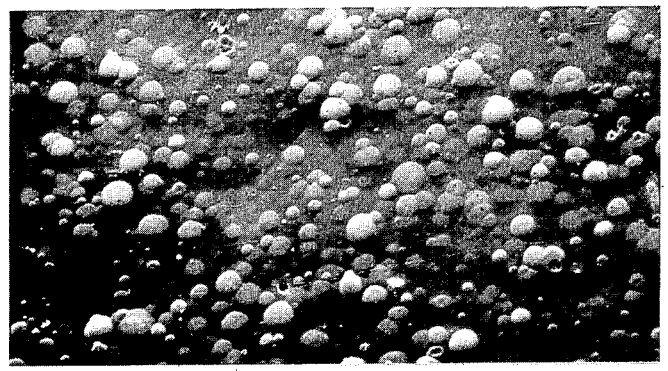
FIG. 6 is an SEM at 500× magnification, showing film treated by the single phase composition as is used by the method of this invention, and as outlined in Example 2 of this application.
Figure 7A:
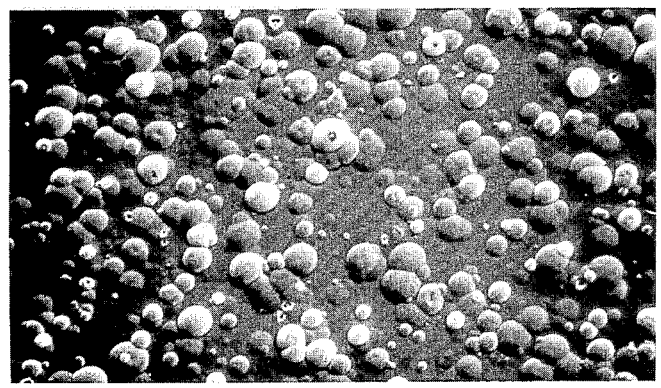
FIG. 7a is an SEM at 500× magnification of nonmicrocracked nickel coating forming a layer of the laminate of this invention.
Figure 7B:
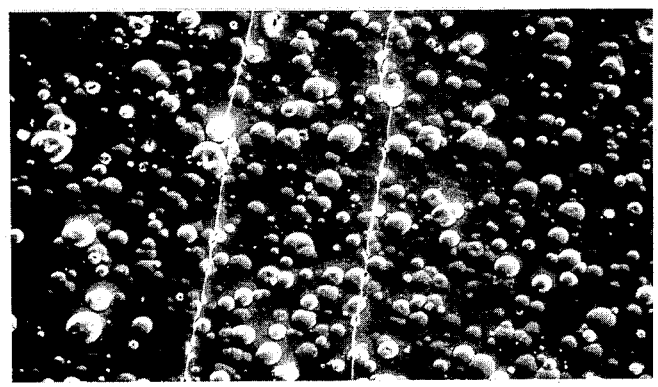
FIG. 7b is an SEM at 250× magnification of the nickel coating as in FIG. 7a containing microcracks.

FIG. 3 shows the surface resulting from the use of Texturant B. This result is compared to the surface resulting from the use of Texturant D as shown in FIG. 6. The use of Texturant D results in a uniform and completely textured (bumped) surface. The surface resulting from the use of Texturant B is incompletely textured as shown by the lack of surface features or roughening. As shown in FIG. 6, the surface resulting from the use of Texturant A has very little surface modification.

These samples are then electrolytically copper plated to a final metal thickness of approximately 35 μm. IPC test 2.4.9, Methods A and C were then performed for initial and post solder float adhesion, respectively, with the following result:

| Sample number | Texturant | Initial Metal | Initial (lb./in.) Side A | Side B | Solder Float Peel (lb./in.) |
|---|---|---|---|---|---|
| 1 | A | Ni | 5.2 | 6.4 | 0.3 |
| 2 | A | Cu | 4.8 | 4.8 | BLOWOFF |
| 3 | B | Ni | 7.4 | 8.5 | 0.4 |
| 4 | B | Cu | 6.7 | 8.4 | BLOWOFF |

-continued

| Sample number | Texturant | Initial Metal | Initial (lb./in.) Side A | Side B | Solder Float Peel (lb./in.) |
|---|---|---|---|---|---|
| 5 | C | Ni | 7.9 | 6.8 | 4.6 |
| 6 | C | Cu | 6.5 | 8.0 | BLOWOFF |
| 7. | D | Ni | 9.4 | 10.0 | 4.4 |
| 8. | D | Cu | 7.5 | 7.1 | BLOWOFF |

All reported adhesion values are for peels at 90 degrees for ⅛th inch traces performed using an Instron model 1000 universal tester. An average of at least three ⅛th inch traces are used for each value shown in the table above. Two major conclusions can be drawn from the information presented in the table above:

1. The homogeneous texturing solution of this invention such as that represented by Texturant C or D provides overall superior solder float performance.

2. Nickel metalization provides superior post solder float performance.

In every case the combination of either Texturant C or D, and the use of electroless nickel provides a superior laminate to that produced by the application of the two-phase texturant as taught by DeAngelo.

The samples using the nickel for initial electroless metalization show more consistent adhesion values which are much higher overall than those obtained with the electroless copper samples. There is no random blowoff on solder float as is found for samples that are metalized initially with electroless copper.

EXAMPLES 3

A four inch by six inch sample of type VN200 Kapton brand polyimide film is prepared as in Example 1 up to the electroless nickel step, but is only plated on one side with electrolytic copper. This selective plating is accomplished by coating one side of the sample with a plating resist. The final laminate structure is comprised of double-sided electroless nickel and 35 μm of electrolytic copper on one side only. This sample is subjected to a more rigorous test than IPC test 2.4.13. "Solder Float Resistance-Flexible Printed Wiring Materials" wherein the sample is tested without removing metal from either side; the samples are cut into two-inch squares, baked at 135±10° C. for one hour; then floated for 10 seconds on solder held at 260±5° C. This sample suffers no blowoffs or delaminations.

EXAMPLE 4

A four inch by six inch sample of type VN200 Kaptron brand polyimide film is laminated on one side with tape, with a water resistant low tack adhesive, and textured as in Example 1. After pretreatment in a palladium catalyst solution, the tape is removed, followed by electroless nickel buildup, and electrolytic plating to 35 μm in a brightened acid copper sulfate bath by the method of Example 1. After plating, ⅛th inch lines are revealed using a copper chloride etchant. After removing surface moisture at 80° C. for 30 minutes, one half of the lines are peel tested for adhesion before solder float, the other half of the lines are subjected to a solder float, and then peel tested as in IPC test 2.4.9, Methods A and C yielding values of 8-9 lb./in., and 4.8 to 5.0 lb./in., respectively.

EXAMPLE 5

This example illustrates the usefulness of the laminates produced by the method disclosed herein for the preparation of circuits by the subtractive method set forth above. Laminate constructions are prepared on type VN200 Kapton brand polyimide film using the procedure of Example 1 on one side of the film up to the point of electrolytic metalization. To prevent treatment of the other side of the film one side of the sample is masked with tape, and the tape is removed just before electroless metalization. For the preparation of a particular type of printed circuit pattern referred to as a TAB (Tape Automated Bonding) circuit (FIG. 2) which is used as chip carrier for mounting integrated circuits (chips) by the subtractive method, the copper is only electroplated to about 18 μm in a brightened copper sulfate bath.

The laminates are first cleaned for one minute at 35° C. in a 1.0 M NaOH solution containing a wetting agent, followed by cleaning for 30 seconds at 25° C. in 1.0% aqueous nitric acid, followed by thorough water rinsing and drying of the sample. The laminates are next coated with a positive liquid photoresist available from Shipley Corp. under the tradename Shipley AZ-119S. A final dry film thickness of 5 μm is obtained after drying at 80° C. for 30 minutes as per manufacturers instructions. A positive photoresist coating is a composition which becomes soluble in an aqueous developing solution on exposure to ultraviolet (UV) light energy. The resist coated laminate is then masked with a phototool and exposed using a NuArc 26-1K ultraviolet exposure unit at 200 millijoules per square centimeter to image the TAB circuit pattern. The exposed resist is then developed in a two stage treatment using Shipley 303A developer from Shipley Corp. The sample is immersed for two minutes in a 25% concentration of the developer followed by 30 seconds in a 20% solution of the developer. A clean, sharp resist image of the TAB circuit pattern is obtained. The resist is then post baked to harden for one hour at 125° C. The exposed copper and underlying electroless nickel is removed in a copper chloride etchant.

Figure 2:
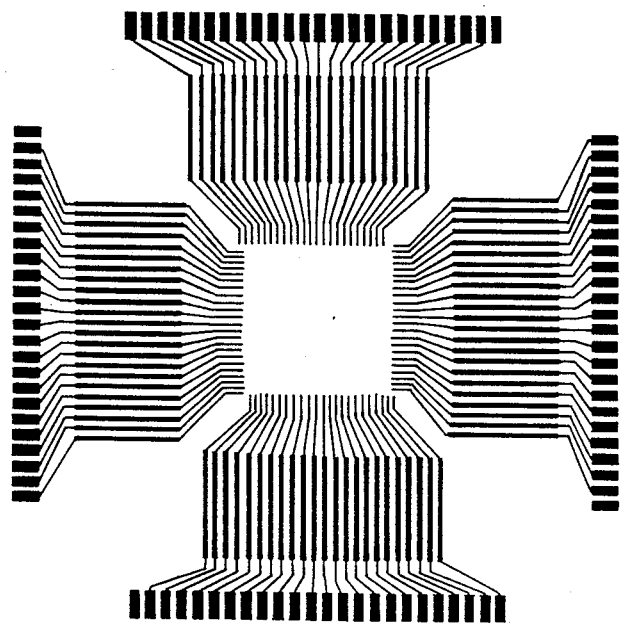
FIG. 2 shows a typical circuit used in Tape Automated Bonding (TAB) producible using a laminate of this invention.

The method of this Example produces a TAB circuit as shown in FIG. 2 with clean line definition of at least 75–100 μm.

EXAMPLE 6

A double-sided copper clad laminate of the type shown in FIG. 3 is prepared by the procedure of Example 1 and tested in accordance with IPC test 2.4.13 as follows:

1. One side of the sample is masked with tape.
2. The metal is then removed from the unmasked side in a copper chloride etchant, and the tape mask is removed.
3. A two-inch square is cut from the specimen.
4. The sample is then placed in an oven at 135±5° C. for one hour.
5. The surface is cleaned by the use of an acid flux.
6. The sample is floated for 10 seconds just beneath the surface of molten solder held at 250±10° C.
7. The uncoated side of the sample is then inspected for metal delamination and separation from the polyimide surface.

No areas of delamination were found, and no separation at the metal/polymer interface was observed.

EXAMPLE 7

A four inch by six inch sample of type VN200 Kapton brand polyimide film is textured with a 60% Hydrazine-9.3% caustic solution as disclosed in Table II of U.S. Pat. No. 4,078,096 to Redmond et al. The treated sample is then plated in accordance with Example 1 of this application. An average peel strength of only 4.0 lb./in. is obtained for samples prepared in this manner. The bond failure appears to be within the polymer film itself, which is good indication that the cohesive strength of the film has been reduced.

Figure 4:
FIG. 4 is an SEM at 500× magnification, showing the textured film made by the method of Redmond as outlined in Example 7 of this application.
Figure 5:
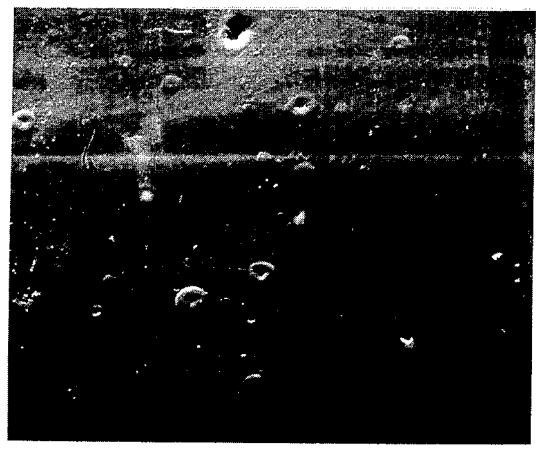
FIG. 5 is an SEM at 500× magnification, showing film treated by the modified method of DeAngelo (where potassium hydroxide is substituted for sodium hydroxide) as outlined in Example 2 of this application.

As shown by FIG. 4, the Redmond et al treated surface is incompletely and non-uniformly textured. In contrast, the polyimide surface treated in accordance with this invention has a uniformly and completely textured surface.

EXAMPLE 8

Six four inch by six inch pieces of 2.0 mil Apical film from Kanegefuchi Corp. and sold through the Allied Signal Corporation, are textured, electrolessly nickel/boron plated on both sides of the film, microcracked and baked followed by the electrolytic copper buildup to 35 μm according to the method of Example 1. Apical film is reported to be chemically identical to Kapton brand polyimide film, and this Example illustrates the applicability of the method of this invention to other commercially available polyimide films. The Apical film textures well although the nodular bumps are of slightly larger size than those on Kapton brand polyimide film, and when the Apical is electrolessly nickel/boron plated it has a more lustrous appearance than Kapton polyimide film. The following results are an average of the six samples.

| # of Cycles | Cracked/Baked Adhesion (lb/in) |
| --- | --- |
| 0 | 6.5(avg) |
| 3 | 5.5(avg) |

EXAMPLE 9

In order to determine the possible texturant compositions, a three component mixture phase diagram was prepared, the miscible regions were defined, and the two phase regions were eliminated from the experimental design. Representative mixtures were identified, and then investigated in order to get more specific data. For these experiments, 100 gms of each texturant composition shown in the following table were prepared, and three 3 inch square samples of Kapton were treated in each solution for 60 seconds at 35±2° C. The weight loss for each sample was measured, and the samples were viewed under a light microscope for a qualitative comparison of the bumping which resulted from each treatment.

| SAMPLE | WGT % MeOH | WGT % EDA | WGT % 45% KOH | AVG OF 3 % WGT LOSS | TEXTURE HI/MED/LO |
| --- | --- | --- | --- | --- | --- |
| A | 10 | 5 | 85 | 28.6 | MED |
| B | 90 | 5 | 5 | 12.7 | NONE |
| S | 18 | 77 | 5 | 8.7 | LO |
| D | 36 | 32 | 32 | 27.0 | MED |
| E | 50 | 5 | 45 | 9.5 | LO |
| F | 50 | 45 | 5 | 7.4 | LO |
| G | 20 | 40 | 40 | 2 PHASE | |
| H | 10 | 20 | 70 | 42.6 | HI |
| I | 20 | 60 | 20 | 13.8 | LO |
| J | 25 | 18 | 57 | 30.7 | HI |
| K | 63 | 18 | 19 | 1.1 | NONE |

-continued

| SAMPLE | WGT % MeOH | WGT % EDA | WGT % 45% KOH | AVG OF 3 % WGT LOSS | TEXTURE HI/MED/LO |
| --- | --- | --- | --- | --- | --- |
| L | 40 | 40 | 20 | 9.0 | LO |

Figure 10:
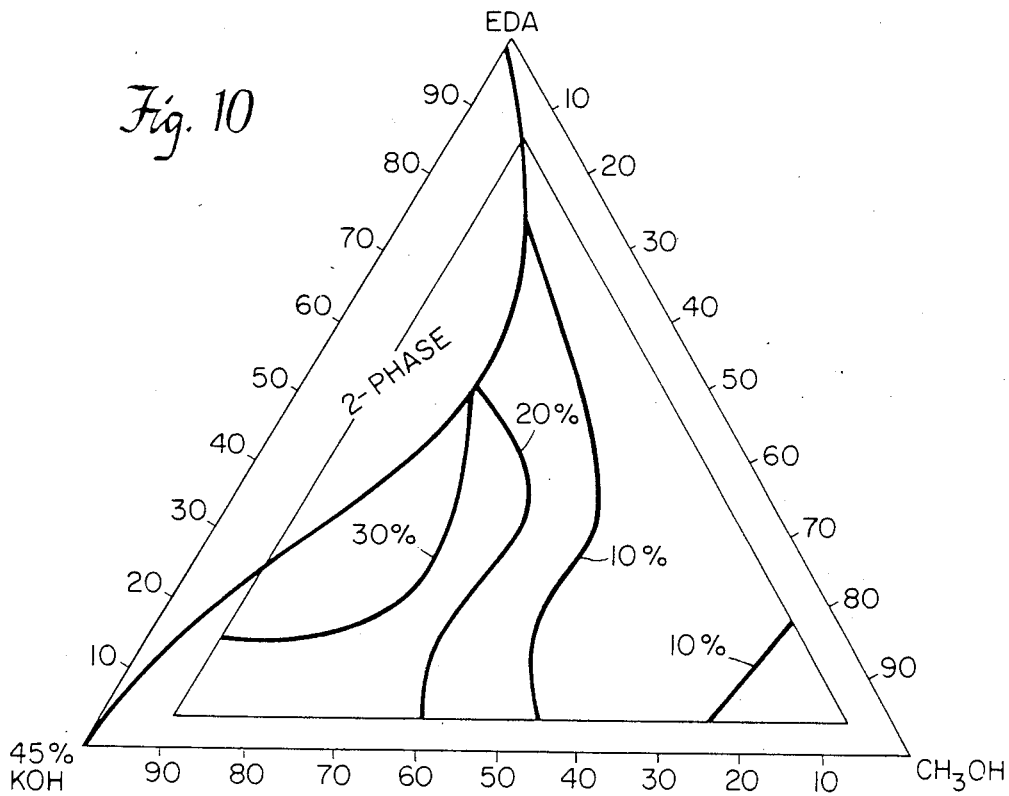
FIG. 10 is a three component mixture diagram showing contour lines of percentage weight loss for texturant compositions as described in Example 9.

FIG. 10 shows the location of contour lines for the degree of milling to be expected for any of the single phase compositions possible for these three components. These lines are approximate, and show that there are many possible variations in the exact texturant compositions that will both mill and texture the polyimide films. In all of the diagrams the two phase mixture is shown, and the DeAngelo texturants, which do not provide the uniformly bumped surface as the single phase mixture of use in the method of this invention fall into this two phase area. Note that the texturant composition at the lower right vertex of the mixture diagram mills the film to some extent; However, this composition contains too little ethylene-diamine to cause a bumped and nodular surface to the polyimide film.

We claim:

1. A process for coating both surfaces of a polyimide sheet with copper in the absence of an adhesive, said process comprising contacting said sheet with a one-phase solution comprising a diamine with the formula $H_2N(CH_2)_nNH_2$ wherein n is an integer between 2 and 6, an alkali metal hydroxide, a water miscible alcohol and water for a time, and at a temperature sufficient to render the surfaces uniformly and substantially completely textured, treating said surfaces with a catalyst to create surfaces receptive to the electroless deposition of nickel or cobalt, depositing nickel or cobalt on said receptive surface by electroless deposition to form nickel or cobalt coated surfaces of said sheet, said deposited nickel or cobalt coatings being electrically conductive, forming microcracks in each of said nickel or cobalt coatings, baking said polyimide sheet coated with nickel or cobalt containing microcracks to volatilize components in said polyimide sheet while avoiding delamination of said coatings and depositing copper on said nickel surface or cobalt surface by electrolytic deposition to form exposed copper coatings on said polyimide sheet.

2. The process of claim 1 wherein said diamine is ethylenediamine.

3. The process of claim 1 wherein nickel is electrolessly deposited.

4. The process of claim 3 wherein the diamine is ethylenediamine.

5. The process of claims 3 or 4 where the initial metal layer is a nickel/boron alloy.

6. The process of claims 3 or 4 where the initial metal layer is a cobalt/boron alloy.

7. The process of claims 3 or 4 where the initial metal layer is an alloy of nickel/cobalt/boron.

8. The process of any one of claim 1, 2, 3 or 4 wherein said alkali metal hydroxide is potassium hydroxide.

9. The process of any one of claims 1, 2, 3 or 4 wherein said alkali metal hydroxide is sodium hydroxide.

10. The process of any one of claims 1, 2, 3 or 4 wherein said alkali metal hydroxide is mixture of potassium and sodium hydroxide.

11. The process of any one of claims 1, 2, 3 or 4 wherein said alcohol is methanol.

12. The process of any one of claims 1, 2, 3 or 4 wherein said alcohol is ethanol.

13. A process for coating both surfaces of a polyimide sheet with copper in the absence of an adhesive, said process comprising contacting said sheet with a one-phase solution comprising a diamine with the formula $H_2N(CH_2)_nNH_2$ where n is an integer between 2 and 6, an alkali metal hydroxide, a water miscible alcohol and water for a time, and at a temperature sufficient to render the surface uniformly and substantially completely textured, treating said surfaces with a catalyst to create surfaces receptive to the electroless deposition of nickel or cobalt, depositing nickel or cobalt on said receptive surface by electroless deposition to form nickel or cobalt coated surfaces of said sheet, said deposited nickel or cobalt coatings being electrically conductive, electrolytically depositing a thin layer of copper having a thickness less than about 2.0 μm on each of said nickel or cobalt coatings to form dual metal coatings, forming microcracks in each of said dual metal coatings, baking said polyimide sheet coating with said dual metal coatings containing microcracks to volatilize components in said polyimide sheet while avoiding delamination of said coatings and depositing copper on said dual metal coatings by electrolytic deposition to form exposed copper coatings on said polyimide sheet.

14. The process of claim 13 wherein said diamine is ethylenediamine.

15. The process of claim 13 wherein the nickel is electrolessly deposited.

16. The process of claim 15 wherein said diamine is ethylenediamine.

17. The process of claims 13 or 14 where the nickel or cobalt coating layer is a nickel/boron alloy.

18. The process of claims 13 or 14 where the nickel or cobalt coating layer is a cobalt/boron alloy.

19. The process of claims 13 or 14 where the nickel or cobalt coating layer is an alloy of nickel/cobalt/boron.

20. The process of any one of claims 13, 14, 15 or 16 wherein the electroless metal coating is coated directly with electrolytically deposited copper without drying between the step of depositing electroless metal and the step of depositing copper.

21. The process of any one of claims 13, 14, 15 or 16 wherein said alkali metal hydroxide is potassium hydroxide.

22. The process of any one of claims 13, 14, 15 or 16 wherein said alkali metal hydroxide is sodium hydroxide.

23. The process of any one of claims 13, 14, 15 or 16 wherein said alkali metal hydroxide is a mixture of potassium and sodium hydroxide.

24. The process of any one of claims 13, 14, 15 or 16 wherein said alcohol is methanol.

25. The process of any of claims 13, 14, 15 or 16 wherein said alcohol is ethanol.

* * * * *